(12) United States Patent
Merkel (10) Patent No.: US 10,891,536 B1
(45) Date of Patent: Jan. 12, 2021

(54) ARTIFICIAL NEURAL NETWORK FOR RESERVOIR COMPUTING USING STOCHASTIC LOGIC

(71) Applicant: GOVERNMENT OF THE UNITED STATES AS REPRESENTED BY THE SECRETARY OF THE AIR FORCE, Rome, NY (US)

(72) Inventor: Corey E. Merkel, Liverpool, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 903 days.

(21) Appl. No.: 15/604,773

(22) Filed: May 25, 2017

Related U.S. Application Data (60) Provisional application No. 62/430,521, filed on Dec. 6, 2016.

(51) Int. Cl.
*G06N 3/04* (2006.01)
*H03M 7/26* (2006.01)

(52) U.S. Cl.
CPC ................ *G06N 3/04* (2013.01); *H03M 7/26* (2013.01)

(58) Field of Classification Search
CPC .................................... G06N 3/04; H03M 7/26
See application file for complete search history.

(56) References Cited

PUBLICATIONS

Alomar et al. Stochastic-Based Implementation of Reservoir Computers. I. Rojas et al. (Eds.): IWANN 2015, Part II, LNCS 9095, pp. 185-196, 2015. (Year: 2015).*

Verstraeten et al. Reservoir Computing with Stochastic Bitstream Neurons. Proceedings of the 16th Annual ProRISC Workshop, Veldhoven, the Netherlands, Nov. 2005, pp. 454-459 (Year: 2005).*

Gargesa, Padmashri, "Reward-driven Training of Random Boolean Network Reservoirs for Model-Free Environments" (2013). Dissertations and Theses. Paper 669. (Year: 2013).*

Schrauwen, Benjamin & Verstraeten, David & Campenhout, Jan. 2007. An overview of reservoir computing: Theory, applications and implementations. Proceedings of the 15th European Sympsosium on Artificial Neural Networks. 471-482. (Year: 2007).*

* cited by examiner

*Primary Examiner* — Alexey Shmatov
*Assistant Examiner* — Robert Bejcek, II
(74) *Attorney, Agent, or Firm* — Adam G Pugh (57) ABSTRACT

An artificial neuron includes a signal mixer that combines input signals to provide a first stochastic bit-stream as output and a stochastic activation function circuit configured to receive the first stochastic bit-stream from the signal mixer and to generate therefrom a second stochastic bit-stream. The first stochastic bit-stream is representative of a first output value. In the stochastic activation function circuit, n independent stochastic bit-streams, each representative of the first output value, are summed to provide a selection signal that is provided to a multiplexer to select between n+1 coefficient bit-streams and provide the second stochastic bit-stream. The activation function has a characteristic determined by the proportion of ones in each of the n+1 coefficients bit-streams. One or more artificial neurons may be used in an Artificial Neural Network, such as a Time Delay Reservoir network.

16 Claims, 8 Drawing Sheets

ARTIFICIAL NEURAL NETWORK FOR RESERVOIR COMPUTING USING STOCHASTIC LOGIC

CROSS-REFERENCE TO RELATED APPLICATION

This application claims the benefit of U.S. Provisional Application No. 62/430,521 filed Dec. 6, 2016, where the entire content of the foregoing application is hereby incorporated by reference.

STATEMENT OF GOVERNMENT INTEREST

The invention described herein may be manufactured, used and licensed by or for the Government of the United States for all governmental purposes without the payment of any royalty.

FIELD OF THE INVENTION

The present disclosure relates generally to methods, systems, apparatus and devices for implementing artificial neural networks using stochastic logic.

BACKGROUND OF THE INVENTION

Artificial Neural Networks (ANNs) are machine learning devices used in many areas, such as the regression, classification, and forecasting of time series data. ANNs contain one or more artificial neurons that, analogous to a human brain neuron, generate an output signal depending on a weighted sum of inputs. Reservoir computing (RC) is used in a type of artificial neural network with an untrained, recurrent hidden layer called a reservoir. A major computational advantage of RC is that the output of the network can be trained on the reservoir states using simple regression techniques, without the need for backpropagation. RC has been successful in a number of wide-ranging applications such as image classification, biological signal processing, and optimal control. Beyond its computational advantages, one of the main attractions of RC is that it can be implemented efficiently in hardware with low area and power overheads.

Artificial Neural Networks may be implemented in various ways, including analog circuits, binary digital circuits, stochastic logic circuits, or combinations thereof. Stochastic logic circuits use stochastic computing techniques, in which data values are represented by streams of random bits. Complex computations can then be computed by simple bit-wise (logical) operations on the streams. Stochastic computations may be performed by stochastic logic devices, which are tolerant of occasional bit errors. A further advantage is that a stochastic logic device can be implemented using simple logic elements.

Deterministic digital circuits, implemented using field programmable gate arrays for example, are susceptible to bit errors and consume more electrical power than a corresponding stochastic logic circuit. Hence, there exists a need for improved design of artificial neural networks using stochastic logic.

BRIEF SUMMARY OF THE INVENTION

The foregoing problems and other shortcomings, drawbacks, and challenges associated with implementing an artificial neural network in hardware are overcome by the embodiments described herein. While the invention will be described in connection with certain embodiments, it is understood that it is not limited to these embodiments. To the contrary, the present invention includes all alternatives, modifications and equivalents within the scope of the embodiments disclosed.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings provide visual representations which will be used to more fully describe various representative embodiments. They can be used by those skilled in the art to better understand the representative embodiments disclosed and their inherent advantages. The drawings are not necessarily to scale, emphasis instead being placed upon illustrating the principles of the devices, systems, and methods described herein. In these drawings, like reference numerals may identify corresponding elements.

DETAILED DESCRIPTION OF THE INVENTION

The various methods, systems, apparatus and devices described herein generally provide for improved Artificial Neural Networks using stochastic logic.

Reservoir computing (RC) is used in a type of artificial neural network with an untrained recurrent hidden layer called a reservoir. A major computational advantage of RC is that the output of the network can be trained on the reservoir states using simple regression techniques, without the need for backpropagation.

Figure 1:
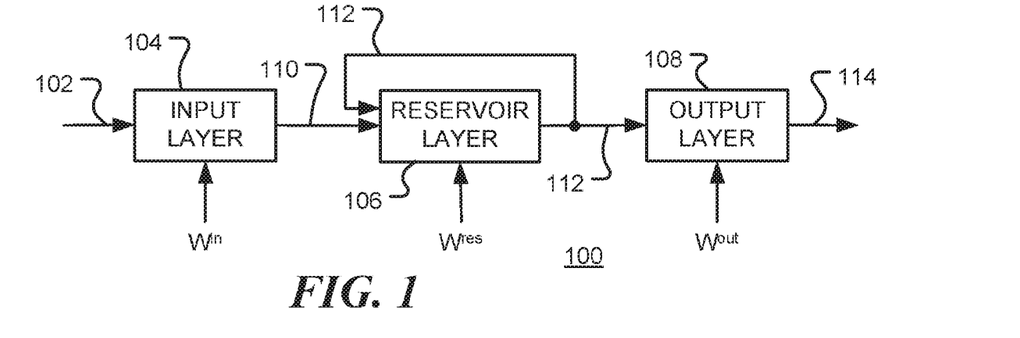
FIG. 1 is a block diagram of a reservoir computing (RC) network.

FIG. 1 is a block diagram of a reservoir computing network 100. The network 100 receives one or more input signals 102 that are processed through input layer 104, reservoir layer 106 and output layer 108. Input layer 104 processes the inputs 102 dependent upon a set of input weights $W^{in}$ to produce signal 110. Input layer 104 may include non-linear activation functions and one or more sublayers. Reservoir layer 106 receives the signals 110 and 112 as inputs. Signal 112 corresponds to a previous state of reservoir layer 106. A network where an output is fed back to the input is termed a 'recurrent' network. The output 112 from reservoir layer 106 is passed to output layer 108 where it is processed, dependent upon a set of output weights $W^{out}$, to produce final output signal 114. Reservoir layer 106 is also referred to simply as the 'reservoir'.

There are three major categories of reservoir computing (RC) networks. The first category, referred to as echo state networks (ESNs), utilizes reservoirs that are implemented using a recurrent network of continuous (e.g., logistic sigmoid) neurons. The second category, referred to as liquid state machines (LSMs), utilizes recurrent connections of spiking neurons (e.g., leaky integrate-and-fire neurons). A challenge in both of these categories is routing. A reservoir with H neurons will have up to $H^2$ connections, potentially creating a large circuit area and a large power overhead. A third category of RC, called time delay reservoirs (TDRs), avoids this overhead by time multiplexing resources. TDRs utilize a single neuron and a delayed feedback to create reservoirs with either a chain topology or even full connectivity.

Besides a reduction in routing overhead, TDRs have two key advantages over ESNs and LSMs. First, adding additional neurons to the reservoir is comparatively less complicated and amounts to increasing the delay in the feedback loop. Second, TDRs can use any dynamical system to implement their activation function and can easily be modeled via delay differential equations. This second point is particularly useful since it means that TDRs can be implemented using a variety of technologies. For example, a Mackey-Glass oscillator, which models a number of physiological processes (e.g., blood circulation), may be used as a non-linear node in a TDR. A TDR may be implemented using a coherently driven passive optical cavity, for example. A TDR may also be implemented using a single XOR gate with delayed feedback. A common feature of all of these implementations is that they are analog and some, such as the photonic implementation, are still large prototypes that have yet to be integrated into a chip. Aside from the higher cost and design effort for analog implementations, they are much more susceptible to noise, especially in RC, where the system operates on the edge of chaos.

Digital RC designs, and digital circuits in general, have much better noise immunity compared to analog implementations. One of the challenges with digital implementations is that the area cost can be high due to the requirement of multipliers for input weighting and implementation of the activation function. This is especially true if high precision is required. However, not all applications require high precision. An alternative design approach to conventional digital logic is stochastic logic, where data values are represented as stochastic bit streams and characterized by probabilities. In one embodiment of the disclosure, a TDR is implemented using stochastic logic.

Figure 2:
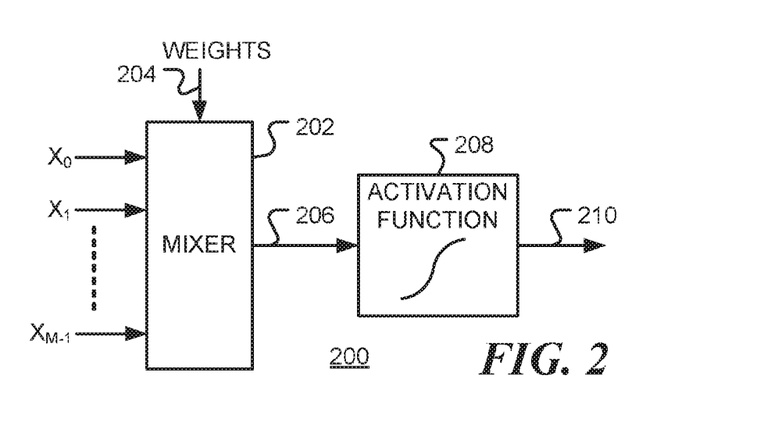
FIG. 2 is a block diagram of an artificial neuron.

Artificial Neural Networks use one or more artificial neurons. FIG. 2 is a block diagram of an artificial neuron 200. Mixer 202 of artificial neuron 200 uses a set of synaptic weights 204 to produce a weighted sum 206 of M input signals $X_0, X_1, \ldots X_{M-1}$. Weighted sum 206 is supplied to an 'activation function' 208 to produce the neuron output 210. The activation function 208 defines the relationship between the output 210 and the weighted sum of inputs 206. References to a 'neuron' in the sequel generally refer to an artificial neuron.

In accordance with embodiments of the disclosure, an artificial neuron is implemented in hardware using stochastic logic.

In accordance with further embodiments of the disclosure, the mixer or weighting function is implemented in hardware using stochastic logic.

Time Delay Reservoirs

Reservoir Computing (RC) makes use of a random recurrent neural network and may be applied in a number of areas, such as regression, forecasting, or classification of time series data. FIG. 1 shows the basic structure of an RC network. Time series input 102, which is denoted as $u^{(p)}$, are multiplied by a random weight matrix $W^{in}$ in the input layer 104 to produce signal 110, which is denoted as $s^{(p)} = W^{in} u^{(p)}$. Here, the index p is used to denote a discrete time-step. Signal 110, at successive times, is then used as inputs to reservoir layer 106. Within reservoir layer 106 there are a number of neurons that are connected with each other through a random weight matrix $W^{res}$. The state $x^{(p+1)}$ of the reservoir layer at time step p+1, indicated by signal 112, is related to the state at time step p by $x^{(p+1)} = f(W^{res} x^{(p)} + s^{(p)})$, where $f$ is an activation function. The signal 112, indicative of the state of the reservoir $x^{(p)}$, is then connected to output layer 108 via a third weight matrix $W^{out}$ to provide the output signal 114 denoted as $\hat{y}^{(p)} = c(W^{out} x^{(p)})$, where c is an output function. In the embodiment described below, c is an identity function, such that the output is given directly by the product of the output weight matrix and the reservoir state. However, other output functions may be used without departing from the present disclosure. Output layer 108 may be trained such that the reservoir performs a particular function (e.g., regression, classification) of the inputs. For example, the output weights may be computed as $$W^{out} = \operatorname*{argmin}_{W^{out}} \frac{1}{2} \sum_{p=1}^{m_{train}} \left(y^{(p)} - \hat{y}^{(p)}\right)^2, \quad (1)$$

where $y^{(p)}$ is the expected output at time-step p and $m_{train}$ is the size of the training set. This optimization problem may be solved via regularized least squares or other method.

The regularized least squares weight values are:

$$W^{out*} = (X^T X + \lambda I)^{-1} X^T Y, \quad (2)$$

where $\lambda$ is the regularization parameter, I is the identity matrix, X, and Y are the matrices composed of the reservoir states and the expected outputs corresponding the training set $U_{train}$, respectively. Note that the only parameters that are modified during training are the output weights $W^{out}$. The random input and reservoir layers serve to randomly project the input into a high-dimensional space, which increases the linear separation of inputs. In addition, the recurrent connections of the reservoir provide a short-term memory that allows inputs to be integrated over time. This enables analysis of the data based on their behavior over multiple time-steps.

Figure 3:
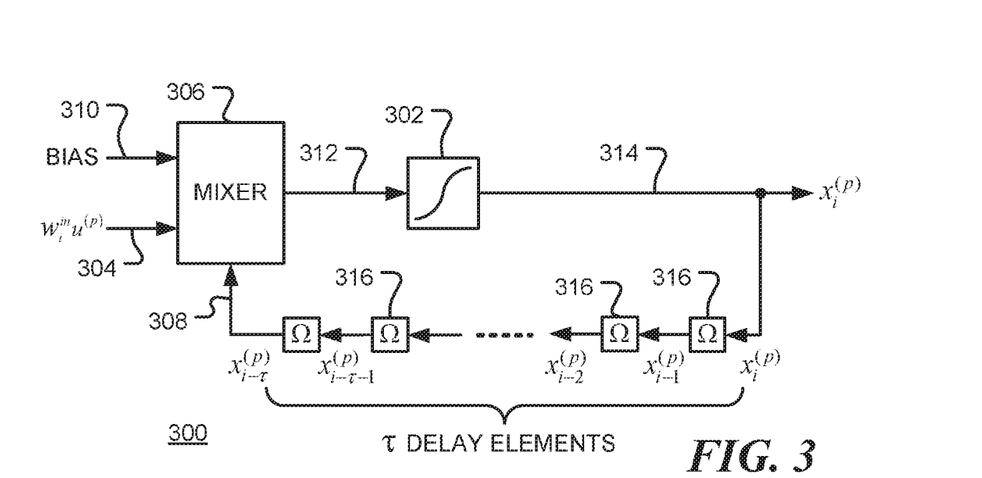
FIG. 3 shows a reservoir layer of an RC network, consistent with embodiments of the disclosure.

A TDR is a special type of RC network that shares resources in time to reduce routing overhead. FIG. 3 shows a reservoir 300 in accordance with embodiments of the disclosure. A single non-linear node provides the activation function 302, analogous to the sigmoid and spiking functions in the ESN and LSM, respectively. The activation function 302 can be any polynomial or transcendental function or may be governed by a delay differential equation. At each time-step p, a new reservoir input is retrieved. For example, the reservoir's input 304 may be sampled from an analog input signal and held for a duration of H smaller time-steps of duration $\Omega$. For each of the H time-steps, the held input is multiplied by an input weight $w_i^{in}$ to provide input 304. At time $t=(pH+i)\Omega$, the input 304 is defined as $s_i^{(p)} \Box s_{t=(pH+t)\Omega} = w_i^{in} u^{(p)}$ for i=0, 1, 2, ..., H. In mixer 306, input signal 304 is mixed with the delayed state 308 of the reservoir node, $x_{i-\tau}^{(p)}$, where $\tau \geq H$ and $\tau\Omega$ is the delay of the feedback, and with a bias signal $\theta_i$, denoted at 310. For example, when $\tau=H$, the delayed state is $x_{i-\tau}^{(p)} = x_i^{(p-1)}$. The resulting sum 312 is then fed back into the activation function 302 to provide the updated output 314, which, at time $t=(pH+i)\Omega$, is given by $$x_i^{(p)} = x_{t=(pH+i)\Omega} = f(\alpha\beta w_i^{in} u^{(p)} + (1-\alpha)\beta x_{i-\tau}^{(p)} + (1-\beta)\theta_i), \quad (3)$$

where $\theta_i$ is the bias term 310 and $\alpha$ and $\beta$ are mixing parameters to be selected.

In this way, $\tau$ components make up the reservoir's state corresponding to each sampled and held input, $u^{(p)}$. The output 314 is passed through delay elements 316 that form a $\tau$-element delay line. This approach is attractive because the hardware implementation comprises a simple circuit and a delay line without the routing overhead associated with ESNs and LSMs. However, TDRs are more restricted in terms of their connectivity patterns and may require numerical simulation of delay differential equations when implemented in software. For an instantaneous activation function (e.g., where the function $f$ settles within $\Omega$) and $\tau=H$, a TDR has a unidirectional ring topology.

Stochastic Logic

In accordance with embodiments of the disclosure, an artificial neuron or a TDR that incorporates an artificial neuron is implemented efficiently in hardware using stochastic computing techniques. Stochastic logic was pioneered half a century ago and was later adopted by the machine learning community to reduce hardware complexity, power, and unreliability. At the heart of stochastic computing is the stochastic representation of binary numbers. In a single-line bipolar stochastic representation, a q-bit 2's complement number $\bar{z} \in \{-2^{q-1}, \ldots, -1, 0, 1, \ldots, 2^{q-1}-1\}$ is mapped to a Bernoulli process Z of length L:

$$z \equiv Pr(Z_r = 1) = \frac{z + 2^{q-1}}{2^q - 1} = \frac{\tilde{z}+1}{2}, \quad (4)$$

where the terms $\bar{z} \in [0,1]$ and $\tilde{z} \in [-1,1]$ are defined for convenience and r=1,2, ..., L is an index into the stochastic bit stream. Converting from the binary to the stochastic representation can be achieved using a random number generator, such as a linear feedback shift register (LFSR), and a comparator. If the random number is less than or equal to the value held in the register, a logic 1 value is produced on the output. Otherwise, the comparator output is logic 0. As the process or stream length L becomes large, $Pr(Z_r=1)$ approaches the value in equation (4). In hardware, this conversion is performed by a binary-to-stochastic (B2S) converter. Converting from a stochastic representation back to a digital number can be achieved by counting the number of 1's and 0's in the stream. By initializing the counter to zero, adding '1' every time a '1' is encountered in the stream and subtracting '1' every time a '0' is encountered, the final counter value will be the 2's complement binary representation of the bit stream. In hardware, this conversion is performed by a stochastic-to-binary (S2B) converter.

In the following description, a 'stochastic bit-stream' refers to a sequence of 1's and 0's. The proportion of 1's in the sequence (i.e., the number of 1's divided by the length of the sequence) is a value in the range [0,1] which may be mapped to any other desired range (such as [−1,1], for example). The term 'stochastic bit-stream' as used herein refers generally to a sequence of bits, whether the sequence is generated in a random, pseudo-random or deterministic manner.

Figure 4A:
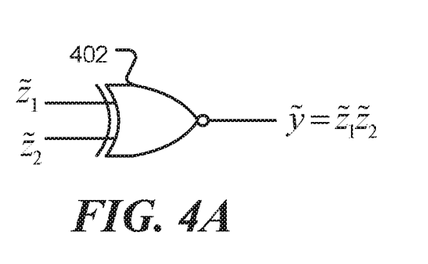
FIGS. 4A-4D show implementations of stochastic logic components, consistent with embodiments of the disclosure.
Figure 4B:
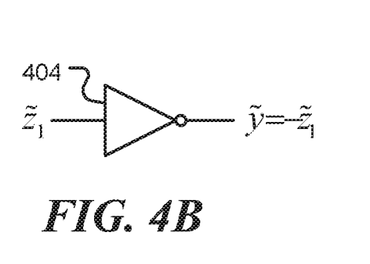
Figure 4C:
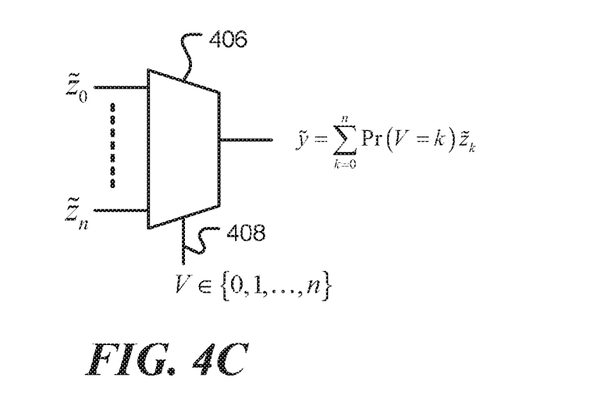

One advantage of a stochastic representation is that several mathematical operations become less complicated to implement in hardware. For example, consider the logic function $Y_i = g(I_1, I_2, \ldots, I_n)$, where each input $I_j$ to the function is mapped to a stochastic bit stream $Z^j$ and, therefore, the output is also a stochastic bit stream. The probability that the function evaluates to '1' is given by $$Pr(Y_i = 1) = \sum_{I_1 I_2 \ldots} f(I_1, I_2, \ldots) \prod_{k=1}^{n} Pr(Z_i^k = I_k), \quad (5)$$

which is a multivariate polynomial in $\bar{z}_1, \bar{z}_2, \ldots, \bar{z}_n$ with integer coefficients and powers no greater than 1. Implementations of a number of stochastic logic components are shown in FIGS. 4A-4D. Note that, in general, the implementation of stochastic logic operations will be different for unipolar representations. For example, in the case of a bipolar representation, multiplication is implemented using an XNOR gate 402 as shown in FIG. 4A. For stochastic bit-streams corresponding to bipolar values $\tilde{z}_1$ and $\tilde{z}_1$ in FIG. 4A, the output corresponds to a bi-polar value $\tilde{y} = \tilde{z}_1 \tilde{z}_2$. However, for a unipolar representation, the same operation uses an AND gate. Negation of a bipolar stochastic representation may be implemented as an inverter 404 as shown in FIG. 4B, while a weighted average of signal may be implemented using a multiplexer 406 as shown in FIG. 4C having a selection signal 408 (V) that selects between the n+1 input bit-streams. The selection signal 408 may be a binary signal or a '1-hot' signal. The weightings are determined by the statistical properties of selection signal 408.

Figure 4D:
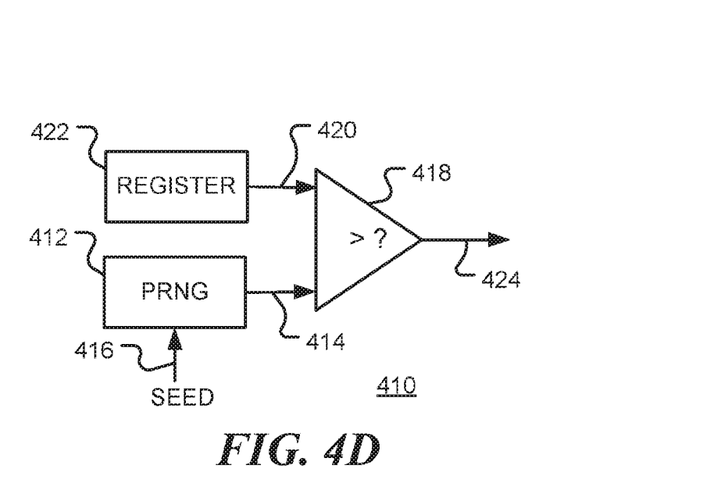

FIG. 4D shows an example of a binary-to-stochastic (B2S) converter 410. Converter 410 includes a random or pseudo-random noise generator 412 that generates a sequence of q-bit values 414. A pseudo-random noise generator 412 may be initialized by a seed value 416 and may be implemented using a linear feedback shift register, for example. Sequence 414 is input to comparator 418, where it is compared to q-bit threshold value 420 contained in register 422. The output 424 is 'one' if the threshold value 420 is greater than the random value 414 and 'zero' otherwise. Noise generator 412 may be used to generate a sequence of length L. When initialized with same seed 416, a pseudo-random noise generator will generate the same sequence 414. In an alternative embodiment, a sequence of values 414 may be pre-stored in a memory.

In addition to the simple mathematical operations shown in FIGS. 4A-4C and the binary-to-stochastic converter shown in FIG. 4D, it is also desired that the stochastic logic RC network implements a non-linear activation function. If the activation function is a polynomial it may be implemented as indicated by equation (5). However, if the activation function is not a transcendental function, then one way to implement it is to approximate it with a polynomial. Bernstein polynomials are a good choice, since they can approximate any function on the unit interval (or any other interval) with arbitrary precision. The Bernstein basis polynomials of degree n are defined as $$b_{k,n}(\bar{z}) = \binom{n}{k} \bar{z}^k (1-\bar{z})^{n-k}, k = 0, 1, \ldots, n. \quad (6)$$

where $$\binom{n}{k}$$

is a binomial coefficient and denotes the number of ways to select k objects from a set of n objects.

A Bernstein polynomial of degree n is defined as a linear combination of the $n^{th}$ degree Bernstein basis polynomials:

$$B_n(\bar{z}) \equiv \sum_{k=0}^{n} \beta_k b_{k,n}(\bar{z}). \quad (7)$$

The n+1 coefficients $\beta_k$ are called the Bernstein coefficients. Furthermore, the $n^{th}$-degree Bernstein polynomial for a function $f(z)$ is defined as:

$$B_n(f; \bar{z}) = \sum_{k=0}^{n} f\left(\frac{k}{n}\right) b_{k,n}(\bar{z}). \quad (8)$$

Bernstein showed that $B_n(f;\bar{z})$ approaches $f(\bar{z})$ uniformly on [0,1] as n approaches infinity. It can also be shown that the set of Bernstein basis polynomials $\{b_{k,n}\}$ of degree n forms a basis for the space of power-form polynomials with real coefficients and degree no more than n. In other words, the power-form polynomial $$p(\bar{z}) = \sum_{i=0}^{n} a_i \bar{z}^i \quad (9)$$

can be written in the form of equation (7). It can be shown that the Bernstein coefficients can be obtained from the power-form coefficients as $$\beta_k = \sum_{i=0}^{k} \binom{k}{j} \binom{n}{j}^{-1} a_i. \quad (10)$$

It is important to note that if $f$ in equation (8) maps the unit interval to the unit interval, then $f(k/n)$ is also in the unit interval. Similarly, if p in equation (9) maps the unit interval to the unit interval, then the Bernstein coefficients in equation (9) will also be in the unit interval. Coefficients in the unit interval are important because they can be represented by stochastic bit-streams.

In summary, any polynomial function that maps the unit interval to the unit interval can be written in the form of a Bernstein polynomial with coefficients that are also in the unit interval. Also, any non-polynomial function that maps the unit interval to the unit interval can be approximated by a Bernstein polynomial with coefficients that are also in the unit interval. To find the coefficients for non-polynomial functions, one may form the constrained optimization problem:

$$\underset{\{\beta_0, \beta_1, \ldots, \beta_n\}}{\text{minimum}} \int_0^1 \left( f(\bar{z}) - \sum_{k=0}^{n} \beta_k b_{k,n}(\bar{z}) \right)^2 d\bar{z}, \quad (11)$$

subject to $\beta_k \in [0, 1] \forall k = 0, 1, \ldots, n$.

This can be solved using numerical techniques, for example.

Figure 5:
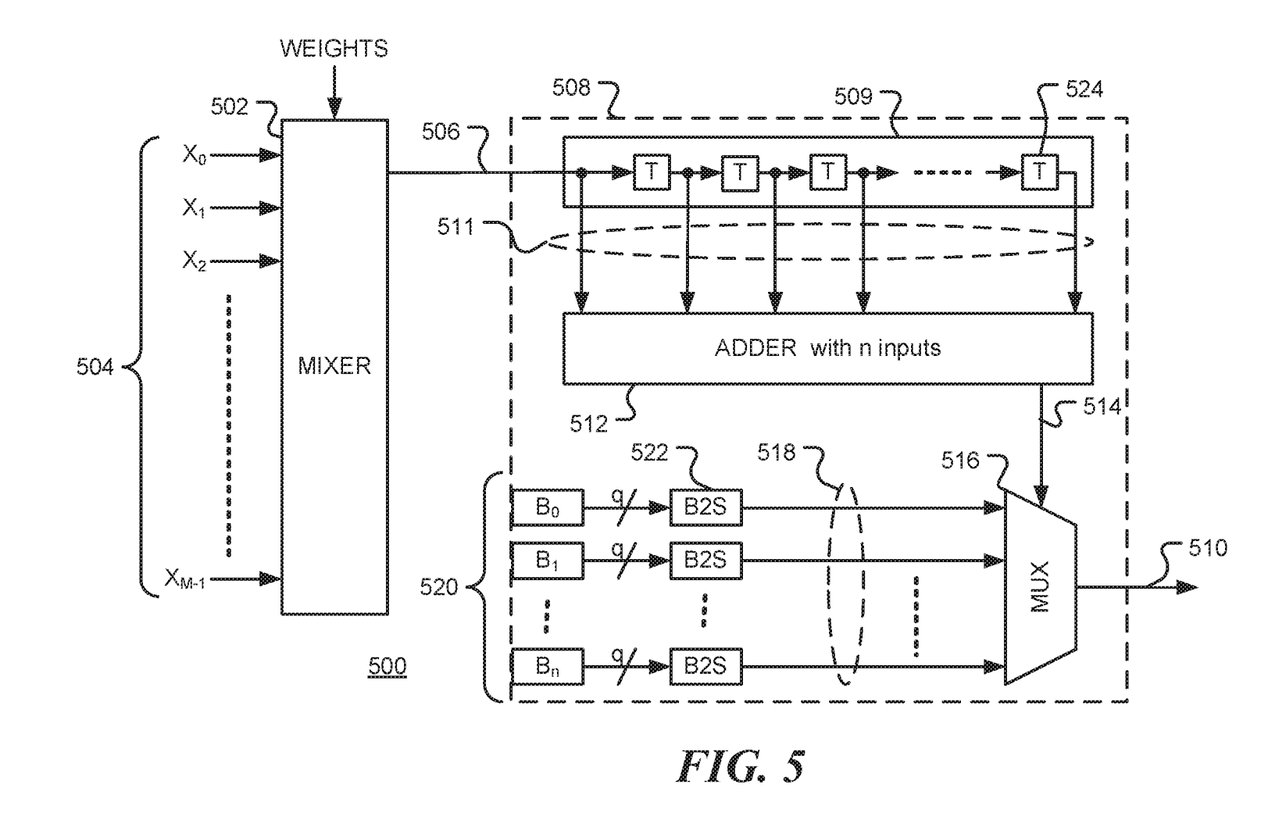
FIG. 5 is a block diagram of a hardware implementation of an artificial neuron, consistent with embodiments of the disclosure.

FIG. 5 is a block diagram of a hardware implementation of an artificial neuron 500, consistent with embodiments of the disclosure. The artificial neuron 500 includes a signal mixer 502 that combines one or more input signals 504 and provides a first stochastic bit-stream 506 as output. A stochastic activation function circuit 508 is responsive to the first stochastic bit-stream 506 to provide a second stochastic bit-stream 510 as output. The first stochastic bit-stream 506 is representative of a first output value. Stochastic activation function circuit 508 includes circuit 509 for generating n independent stochastic bit-streams 511, each representative of the first output value.

Activation function 508 includes adder circuit 512 that is configured to sum the n independent stochastic bit-streams 511 and provide a selection signal 514 as output. Multiplexer 516 is responsive to the selection signal 514 from adder circuit 512 and selects between n+1 stochastic bit-streams 518 dependent upon the selection signal 514 to provide the second stochastic bit-stream.

In one embodiment, adder circuit 512 sums n bits of the first stochastic bit-stream 506 to provide selection signal 514 as output.

In the embodiment shown in FIG. 5, circuit 509 comprises a shift register or delay line comprising multiple delay elements 524, but circuit 509 may take other forms. For example, circuit 509 may include a stochastic-to-binary converter which converts first stochastic bit-stream 506 to a binary value, and a number of binary-to-stochastic converters that convert the binary value to independent bit-streams.

In one embodiment, adder circuit 512 provides an N-bit selection signal as output, where $n<2^N$. Multiplexer 516 selects between n stochastic bit-streams 518, dependent upon the N-bit selection signal 514, to provide the second stochastic bit-stream 510. In a further embodiment, adder circuit 512 provides an (n+1)-bit selection signal as output, where all bits are zero except for one 'hot' bit that is set to one.

The characteristic of activation function 508 is determined by the proportion of ones in each of the n stochastic bit-streams 518. In turn, the n+1 stochastic bit-streams 518 may be produced by converting q-bit values, which are stored in registers 520, using binary-to-stochastic (B2S) converters 522.

In accordance with embodiments of the disclosure, the values stored in registers 520 correspond to Bernstein coefficients. In this manner, Bernstein polynomials are implemented in stochastic logic using only adder 512 and multiplexer (MUX) 516.

By way of explanation, consider an adder with n inputs, each input being a stochastic bit stream $Z_{1,n}$. Furthermore, let each bit-stream comprise independent and identically distributed elements, such that $\bar{z} \equiv \bar{z}_i = \bar{z}_j \forall i, j$. Then, at a particular time t, the adder will be adding n bits, each one being '1' with probability $\bar{z}$. Therefore, for their sum V to be a particular value k requires that k bits are '1' and n–k bits are '0'. The probability of this occurring is $$\binom{n}{k} \bar{z}^k (1-\bar{z})^{n-k}.$$

Now, connecting the adder's output to the select line of a MUX, with inputs equal to the Bernstein coefficients, results in the Bernstein polynomial in equation (7).

One aspect of the present disclosure relates to a hardware embodiment of an artificial neuron. The artificial neuron includes a signal mixer configured to combine one or more input signals and provide a first stochastic bit-stream as output and a stochastic activation function circuit configured to receive the first stochastic bit-stream from the signal mixer and to generate therefrom a second stochastic bit-stream. The signal mixer may be implemented using stochastic logic or using conventional binary logic.

The stochastic activation function includes an adder circuit and a multiplexer. The adder is configured to sum n independent bit-streams and provide a selection signal. Each of the summed bit-streams has the same statistical properties as the first stochastic bit stream.

Since the elements of the first stochastic bit-stream are independent, the bit-streams to be summed may be generated by selecting n elements from the first stochastic bit-stream. For example, the n bits of the first stochastic bit-stream may be stored in a shift register. Alternatively, the first stochastic bit stream may be converted to a binary value and the other independent bit-streams, to be summed, generated by n–1 binary to stochastic converters.

In one embodiment, the adder is a binary adder that generates an N-bit binary selection signal as output, where $n < 2^N$. The multiplexer is responsive to the N-bit selection signal from the adder circuit and is configured to select between n+1 stochastic coefficient bit-streams, dependent upon the N-bit selection signal, to provide the second stochastic bit-stream. In a further embodiment, the adder is a '1-bit hot' adder that generates an (n+1)-bit selection signal.

The n+1 binary polynomial coefficient values may be stored in n+1 registers. n+1 binary-to-stochastic converters may be used to convert the n+1 binary polynomial coefficient values to the n+1 stochastic bit-streams.

In this embodiment, the activation function has a characteristic determined by the proportion of ones in each of the n+1 stochastic bit-streams.

One or more artificial neurons may be used in an artificial neural network circuit.

Stochastic Logic TDR Design

Figure 6:
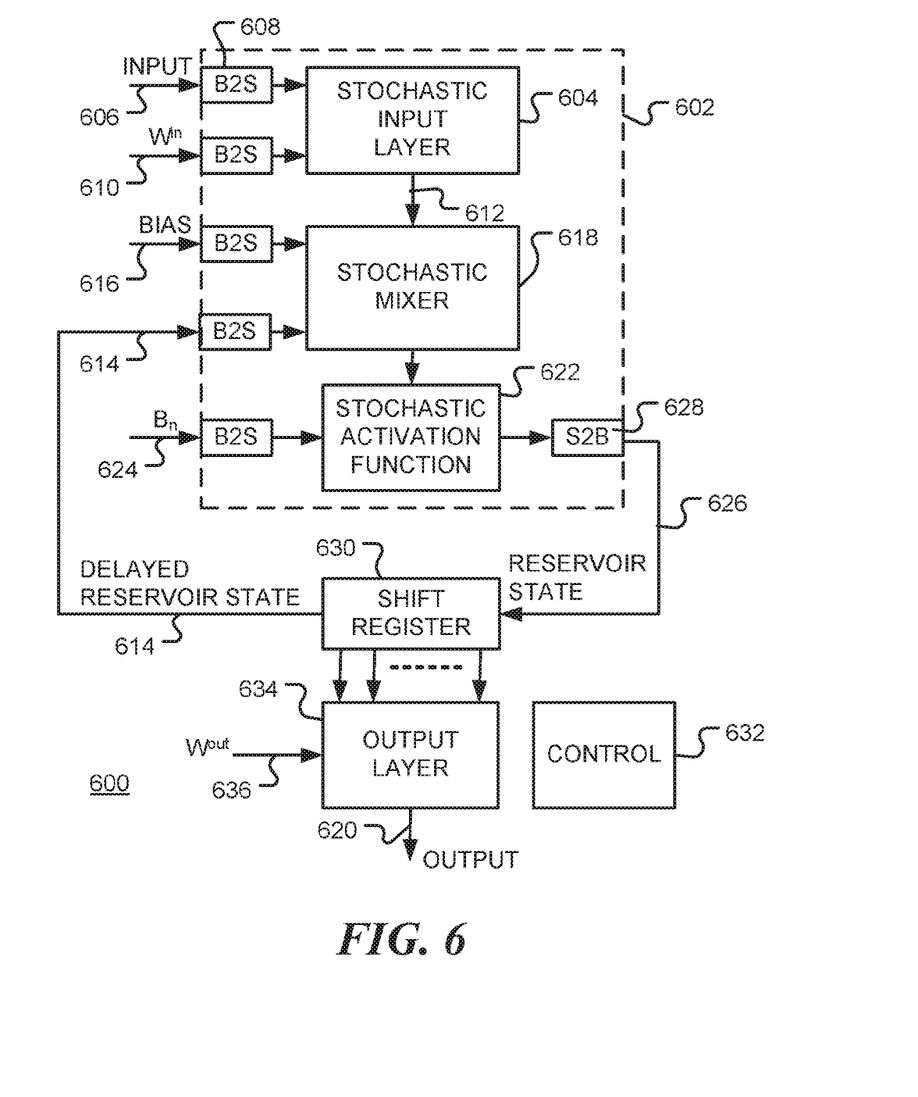
FIG. 6 is a diagrammatic representation of a Time Delay Reservoir (TDR) network implemented using stochastic logic, consistent with embodiments of the disclosure.

FIG. 6 is a diagrammatic representation of a TDR circuit 600 implemented using stochastic logic 602. The TDR circuit 600 comprises three parts that provide the input weights, compute the non-linear activation function, and hold the reservoir state, respectively. The input layer 604 is a weighting stage that takes in a digital signal 606 and converts it to a stochastic bit-stream using a binary-to-stochastic (B2S) converter 608. Digital signal 606 may, in turn, be obtained from an analog signal using an analog-to-digital (A2D) converter. As discussed above, each B2S converter may use a linear feedback shift register (LFSR) to generate a pseudo-random sequence. The number of bits in the LFSR's in each binary-to-stochastic converter (B2S) may be equal to the number of bits q in the binary representation of the input 606. In stochastic input layer 604, the stochastic representation of the input is multiplied by input weights 610. The weights 610 may be stored in registers, for example and converted using a B2S converter to produce weight bit-streams. Multiplication of the resulting weight bit-stream and the stochastic inputs may be performed using an XNOR gate, as discussed above. The weighted signal 612 is mixed with delayed reservoir state 614 and input bias 616 in stochastic mixer 618. This may be implemented using multiplexers, as discussed above. Stochastic activation function 622 provides a non-linear node that approximates a non-linear activation function ƒ(s) using Bernstein polynomials, for example. The characteristic of the stochastic activation function is controlled by coefficients $B_n$ 624, as discussed above.

In the embodiment shown, the output from stochastic activation function 622 is converted back to a binary signal 626 using stochastic-to-binary (S2B) converter 628 and then placed in shift register 630, which holds the entire reservoir state of the reservoir. Although the states could be stored in their stochastic representation, storing them as binary values is more area-efficient since L>>q. TDR circuit 600 may also include control block 632 that controls operation of the components of the circuit, such as an analog-to-digital converter, a sample-and-hold circuit, the B2S, and the S2B. For the sake of simplicity, connections to control block 632 are not shown in the figure. The control block 632 may be implemented as a state machine. Shift register 630 serves as the delay line shown in FIG. 3. In the embodiment shown, the entire reservoir state of the reservoir, which is held in shift register 630, is provided to output layer 634. The states are combined in output layer 634 to provide output signal 620. Training of the output layer may be performed using a stochastic or a non-stochastic technique and is used to determine the output weights 636. In a still further embodiment, the output layer 634 is implemented using stochastic logic.

In FIG. 6, the stochastic mixer 618, stochastic activation function 622 and shift register 630 are components of the reservoir layer of the network.

Figure 7:
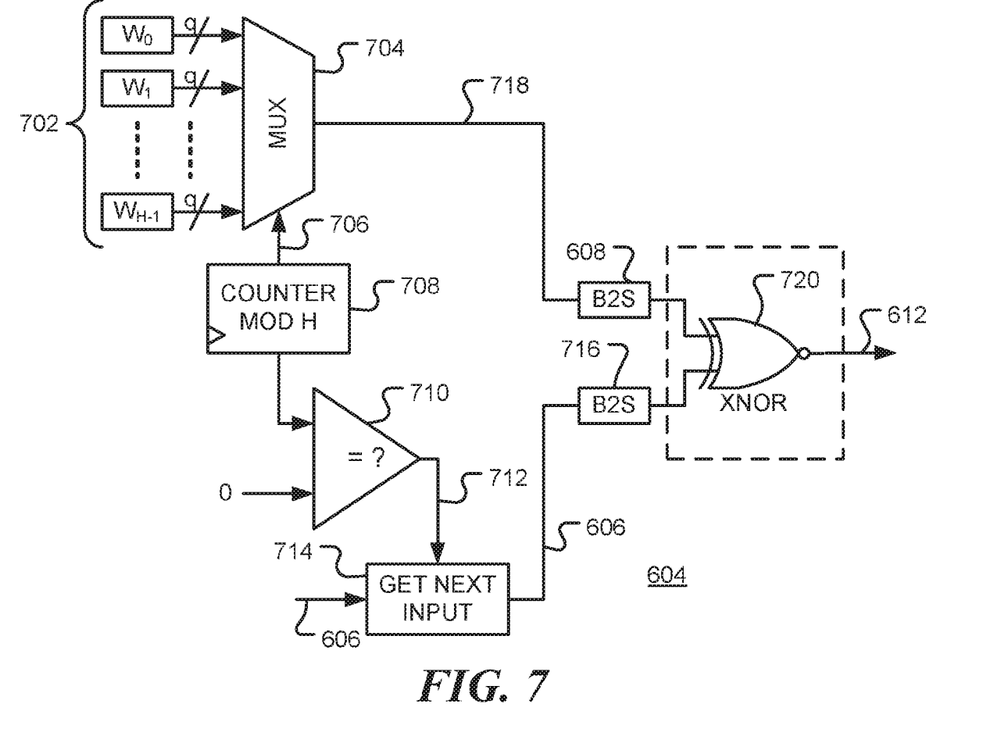
FIG. 7 is a block diagram of a stochastic input layer of a network, consistent with embodiments of the disclosure.

FIG. 7 is a block diagram of a stochastic input layer 604 in accordance with embodiments of the disclosure. Referring to FIG. 7, stochastic input layer 604 includes input weight registers 702 for storing q-bit binary values that are input to multiplexer 704. The H input weights are selected in a cyclic sequence by selection signal 706 generated by counter 708, which counts modulo H, where H is the number of smaller time steps in each input time step. The counter also feeds comparator 710 that asserts output 712 once every H counts. Output 712 controls logic block 714 to retrieve the next value of digital input 606 once every H counts and to hold that value for H counts. The input value 606 may be sampled from an analog signal, retrieved from a memory, or received from a digital stream, for example. The input value 606 ($u^{(p)}$) is converted to a stochastic bit-stream in B2S converter 716, and the selected weight value 718 ($w_i^m$) is converted to a weight bit-stream in B2S converter 608. The resulting bit-streams are input to XNOR gate 720 to produce the stochastic bit-stream 612. Other circuits may be used to generate the weighted input signal.

Figure 8:
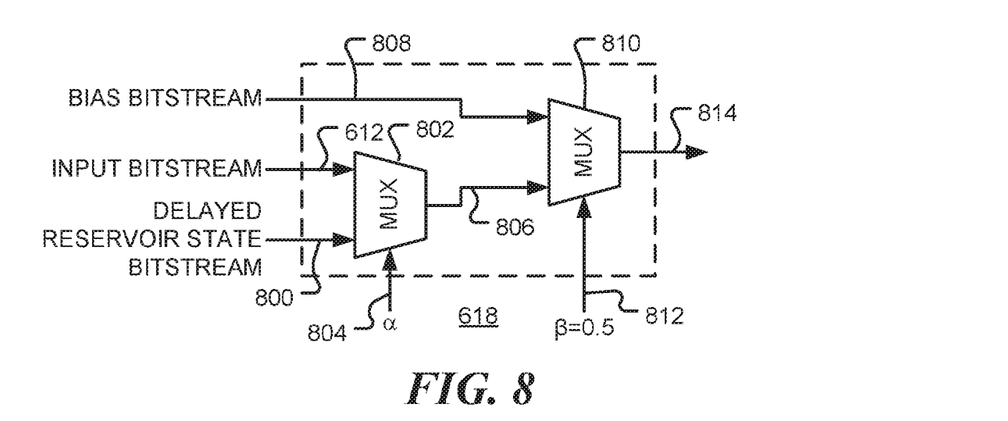
FIG. 8 is a block diagram of a stochastic mixer, consistent with embodiments of the disclosure.

FIG. 8 is a block diagram of a stochastic mixer 618 in accordance with embodiments of the disclosure. At time t=(pH+i)Ω, weighted input bit-stream 612 ($w_i^{in} u^{(p)}$) and delayed reservoir state 800 ($x_{i-\tau}^{(p)}$) are input to multiplexer (MUX) 802. Selector signal 804 is a bit-stream for which the proportion of ones is α (that is, the expected number of ones in a sequence with length L is α/L). The probability of a 'one' in output bit-stream 806 is $\alpha w_i^{in} u^{(p)} + (1-\alpha) x_{i-\tau}^{(p)}$. Bit-stream 806 and bias bit-stream 808 are input to multiplexer 810. Selector signal 812 is a bit-stream for which the proportion of ones is β (that is, the expected number of ones in a sequence with length L is β/L). The probability of a 'one' in the mixer output bit-stream 814 is $\alpha\beta w_i^{in} u^{(p)} + (1-\alpha)\beta x_{i-\tau}^{(p)} + (1-\beta)\theta_i$, where $\theta_i$ is the bias term. The parameter β may have the value 0.5, for example.

Figure 9:
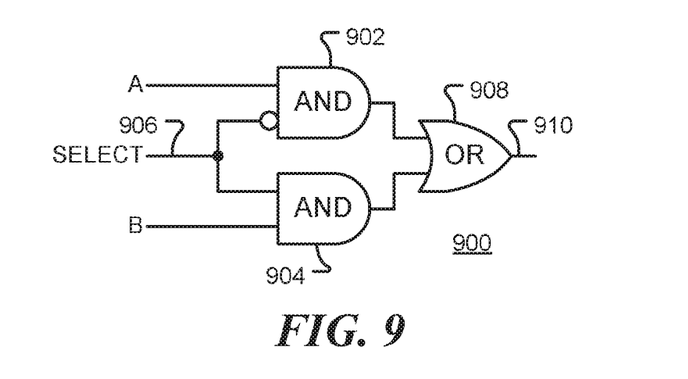
FIG. 9 is a block diagram of an example 2-input multiplexer.

FIG. 9 shows an example 2-input multiplexer 900. Multiplexer 900 comprises AND gates 902 and 904 that receive bit-stream inputs A and B, respectively. When selector signal 906 is 'zero' AND gate 902 outputs signal A, and when selector signal 906 is 'one', AND gate 904 outputs signal B. The outputs are combined in OR gate 908 to provide the selected signal 910. Thus, signal A is selected when signal 906 is 'zero', signal B is selected when signal 906 is 'one'.

Figure 10:
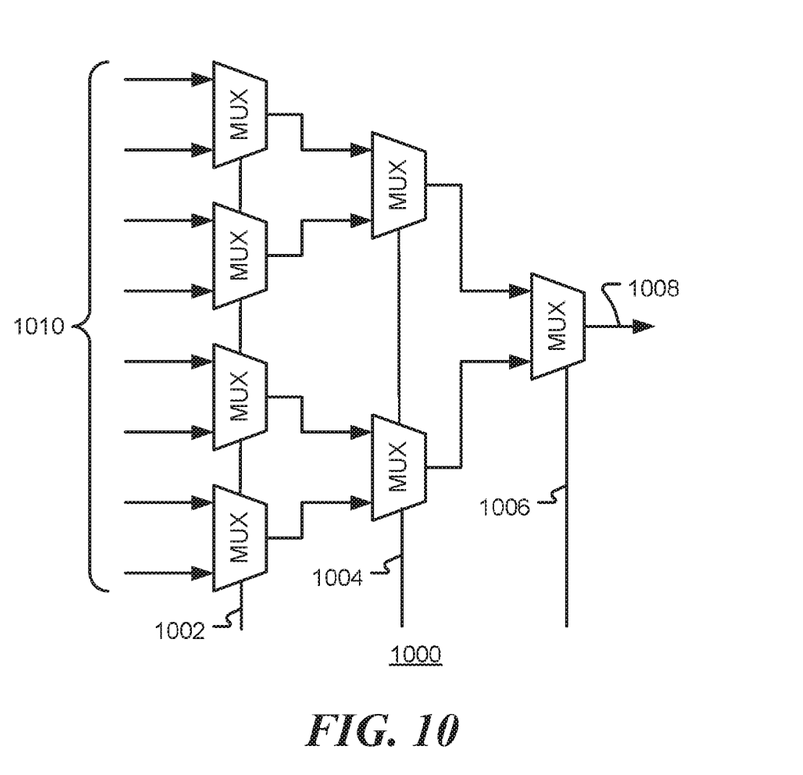
FIG. 10 is a block diagram of an example multi-input multiplexer.

FIG. 10 shows an example multi-input multiplexer 1000. Multiplexer 1000 comprises a network of 2-input multiplexers in a 'tree' arrangement. Selector signal 1002 is supplied to each of the multiplexers in the left-most column, selector signal 1004 is supplied to each of the multiplexers in the center column and selector signal 1006 is supplied to the multiplexer in the right-most column. The output 1008 is selected from the eight inputs 1010.

Figure 11:
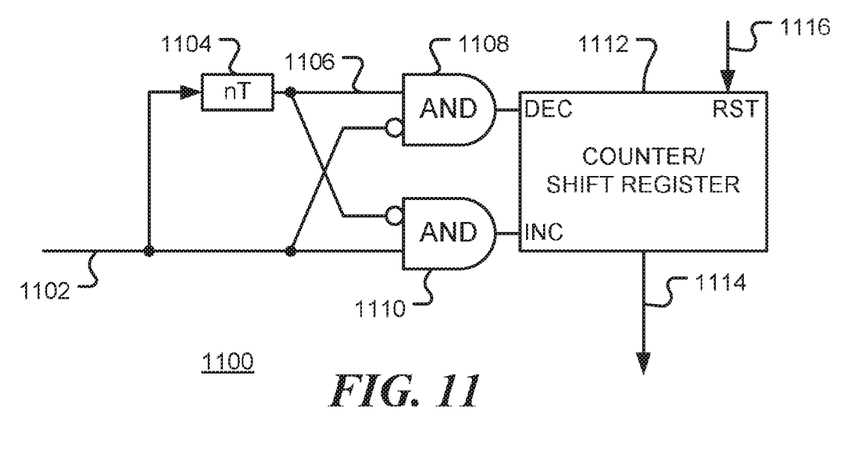
FIG. 11 shows an adder circuit, consistent with embodiments of the disclosure.

FIG. 11 shows an adder 1100 consistent with embodiments of the disclosure. The adder may be used to sum n consecutive elements of bit-stream 1102, for example, to implement adder 512 shown in FIG. 5 in hardware. The addition is performed recursively, recognizing that consecutive sums $S_i$ and $S_{i+1}$ are related by:

$$S_i \square \sum_{k=i}^{n+i} x_k = \sum_{k=i-1}^{n+i-1} x_k + x_{n+i} - x_i = S_{i-1} + (x_{n+i} - x_i). \quad (12)$$

Thus, to obtain the sum $S_i$, the sum $S_{i-1}$ is incremented if $x_{n+i}=1$ and $x_i=0$, decremented if $x_{n+i}=0$ and $x_i=1$, and unchanged otherwise. Adder 1100 receives bit-stream 1102 and delays it by n time steps in delay unit 1104 to provide delayed bit-stream 1106. The delayed bit-stream 1106 and original bit-stream 1102 are combined in AND gates 1108 and 1110 to determine if counter/shift register 1112 should be incremented or decremented. The sum is provided by output 1114. The counter/shift register 1112 may be periodically reset using signal 1116 to reduce the effect of any bit errors.

In one embodiment, counter/shift register 1112 comprises a binary counter that provides an N-bit binary output, where $n < 2^N$. In a further embodiment, counter/shift register 1112 comprises an (n+1)-bit shift register that is initialized to [0,0, . . . ,0,0,1]. The register is shifted left (incremented) if $x_{n+i}=1$ and $x_i=0$, shifted right (decremented) if $x_{n+i}=0$ and $x_i=1$, and left unchanged otherwise. The contents of the shift register 1112 provide an (n+1)-bit, '1-hot', selection signal. Of course, the contents and actions may be reversed.

Figure 12:
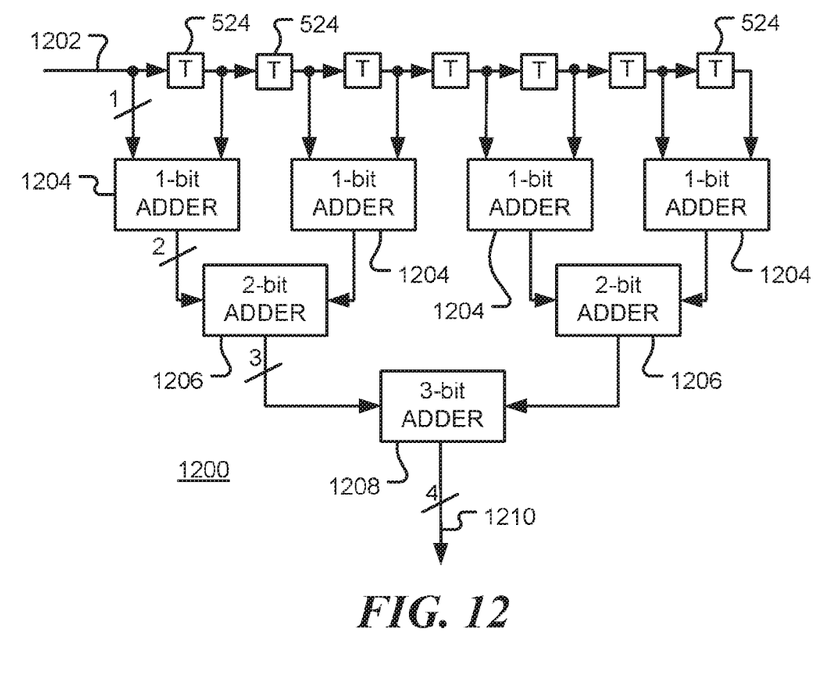
FIG. 12 shows a further adder circuit, consistent with embodiments of the disclosure.

FIG. 12 shows a further adder 1200 consistent with further embodiments of the disclosure. Again, the adder may be used to sum n consecutive element of a bit-stream 1202, for example, to implement adder 512 shown in FIG. 5 in hardware. In this example, eight consecutive elements are added, but fewer or more elements may be similarly combined. Bit-stream 1202 is input to a cascade of delay elements 524 to provide inputs to a row of 1-bit adders 1204. The delay elements may be shift registers and are used to delay the non-linear node's input in order to create multiple statistically independent copies of the same stochastic bit stream. The outputs from 1-bit-adders 1204 are provided to 2-bit adders 1206 and then to 3-bit adder 1208 to provide 4-bit output 1210.

Other adder configurations will be apparent to those of skill in the art.

In one embodiment, for example, the activation function has the form:

$$f(\tilde{s}) = \sin(\gamma \tilde{s}), \quad (13)$$

where γ is a frequency term. However, Bernstein polynomials map the unit interval to the unit interval. By definition, $\tilde{s}$ ranges from −1 to +1, and the sin function also ranges from −1 to +1. In general, any function to be implemented by a Bernstein polynomial has to be shifted and scaled so that the portion of it that is used lies entirely in the unit square. In the case of sin (γ$\tilde{s}$), this is achieved by transforming the function as $$f(\tilde{s}) = \frac{(f(\Delta s[\tilde{s} - 0.5]) - f_{min})}{f_{max} - f_{min}}, \quad (14)$$

where Δs is the domain of interest, $f_{max}$ is the maximum of the function on $$\left[-\frac{\Delta s}{2}, \frac{\Delta s}{2}\right]$$

and $f_{min}$ is the minimum of the function on $$\left[-\frac{\Delta s}{2}, \frac{\Delta s}{2}\right].$$

In an example embodiment, a sequence length L=1000 and a polynomial expansion with n=5 were found to provide a reasonable approximation to the desired activation function.

The design parameters α and Y may be selected with respect to application-dependent metrics such as accuracy, specificity, sensitivity, mean squared error, etc., For example, the design parameters may be varied a parameter space and selected via a grid search. Another approach is to use metrics that capture features such as the reservoir's short-term memory capacity, ability to linearly separate input data, capability of mapping similar inputs to similar reservoir states (generalization), and different inputs to distant reservoir states (separation). These types of application-independent metrics provide more insight into the effects of different parameter choices on the TDRs computing power than metrics like accuracy.

Known metrics such as Kernel quality (KQ) and generalization rank (GR) may be used. KQ is calculated by driving the reservoir with H random input streams of length m. At the end of each sequence, the reservoir's final state vector is inserted as a column into an H×H state matrix X. Then, KQ is equal to the rank of X. It is desired to have X be full rank, meaning that different inputs map to different reservoir states. However, the number of training patterns is usually much larger than H, so if rank(X)=H, it doesn't mean that any training dataset can be fit exactly. In fact, exact fitting, or overfitting, is generally bad, since it means that the TDR (or any machine learning algorithm) won't generalize well to novel inputs. Therefore, another metric, GR, is used to measure the TDR's generalization capability. GR is calculated in a similar way, except that all of the input vectors are identical except for some random noise. GR is an estimate of the Vapnik-Chervonenkis dimension, which is a measure of learning capacity. A low GR is desirable. Therefore, to achieve good performance, the difference KQ-GR should be maximized.

As discussed above, an artificial neural network circuit is responsive to one or more input signals to produce an output signal. The output signal may be indicative of information contained in the input signal. A time delay reservoir (TDR) artificial neural network circuit includes an input layer, a reservoir layer and an output layer. The input layer is responsive to the one or more input signals to produce a first signal. The reservoir layer includes a delay line that receives a second signal as input and provides a third signal as output, a mixer for combining the first signal and the third signal to provide a first stochastic bit-stream as output, and a stochastic logic circuit responsive to the first stochastic bit-stream to produce a second stochastic bit-stream as output. The stochastic logic circuit implements an activation function. The reservoir layer also includes a stochastic-to-binary converter that converts the second stochastic bit-stream to the second signal. The output layer is responsive to values stored in the delay line and a number of output weights to produce the output signal.

The input and output layers may be implemented as stochastic logic circuits, digital circuits, analog circuits, or a combination thereof.

The first signal, produced by the input layer, may be a stochastic bit-stream or a binary signal.

In one embodiment, the input layer includes a stochastic logic circuit with a first binary-to-stochastic converter configured to convert a binary input weight value to a weight bit-stream, a second binary-to-stochastic converter configured to convert an input signal to a signal bit-stream, and a logic gate having the weight bit-stream and the signal bit-stream as inputs and providing the first signal as output. The logic gate comprises an XNOR gate when the binary input weight or the input signal is bipolar, and the logic gate comprises an AND gate when the binary input weight and the input signal are unipolar.

The mixer may be implemented as a stochastic logic circuit having one or more multiplexers or as a conventional binary circuit. The mixer may combine the first signal, the third signal with a bias signal to provide a first stochastic bit-stream as output.

In some embodiments, the stochastic logic circuit that implements the activation function includes an adder circuit and a multiplexer. The adder is configured to sum n bits of the first stochastic bit-stream and provide an N-bit selection signal as output, where $n < 2^N$. The multiplexer is responsive to the N-bit selection signal from the adder circuit and the N-bit selection signal selects between n stochastic bit-streams to provide the second stochastic bit-stream. The resulting activation function has a characteristic determined by the proportion of ones in each of the n stochastic bit-streams.

The artificial neural networks described above may be implemented in an integrated circuit, as described above.

Figure 13:
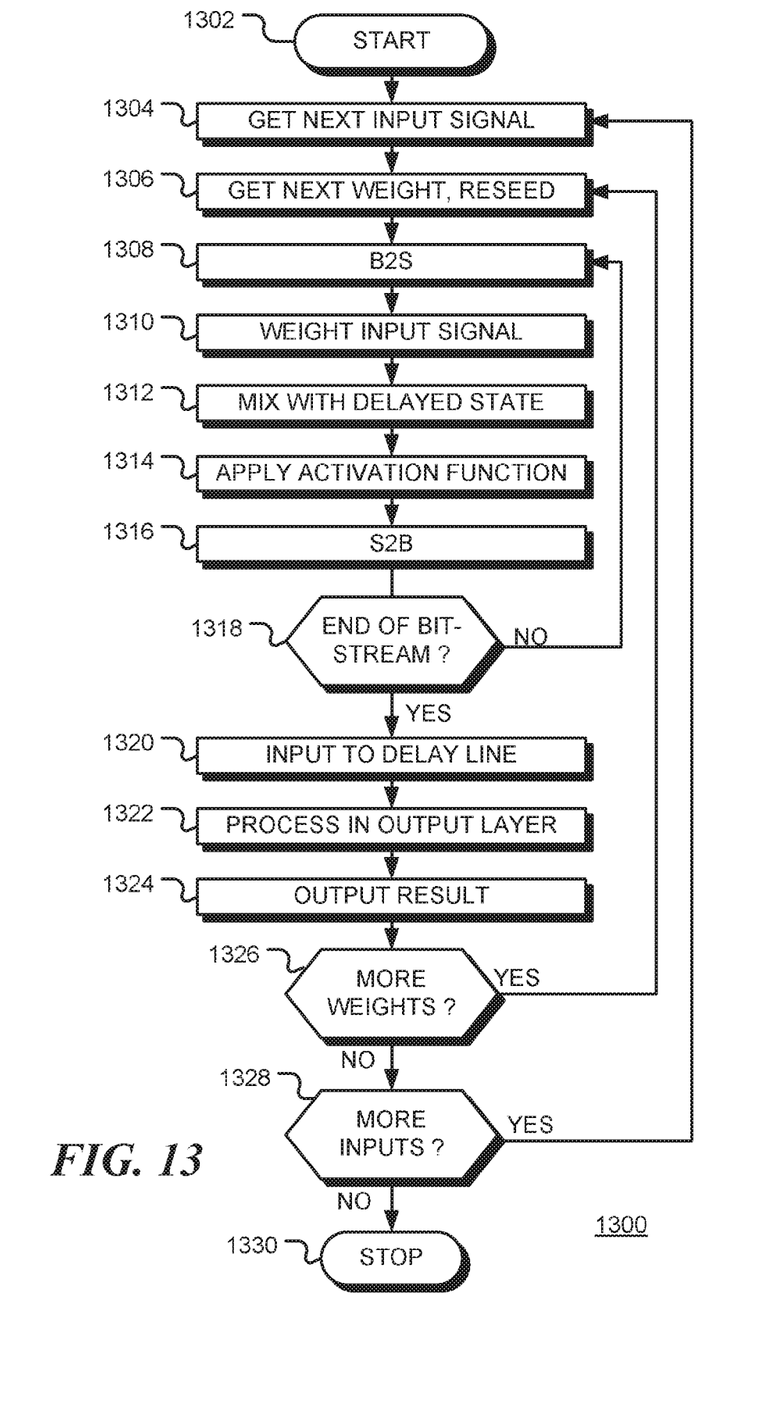
FIG. 13 is a flow chart of a method of operation of a time delay reservoir circuit, consistent with embodiments of the disclosure.

FIG. 13 is a flow chart 1300 of a method of operation of a time delay reservoir circuit in accordance with embodiments of the disclosure. Following start block 1302, a next input signal is obtained at block 1304 and an input weight is selected at block 1306. Optionally, at block 1306, the pseudo-random number generators of one or more binary-to-stochastic converters in the circuit are reseeded. Different seeds may be used for different pseudo-random number generators, but a given pseudo-random number generator may use the same seed at each iteration. In an alternative embodiment, the pseudo-random number generators may be replaced by fixed sequences for which the probability of a 'one' is 0.5. At block 1308, the weight and the input signal are converted to bit-streams. At block 1310, the weight and input bit-streams are combined to produce a weighted input bit-stream. This is mixed with a delayed reservoir signal to provide a first stochastic bit-stream at block 1312. At block 1314, a second stochastic bit-stream is produced by applying the first stochastic bit-stream to a stochastic logic circuit configured to provide an activation function. At block 1316, a binary representation of the second stochastic signal is updated. The binary representation of the second stochastic signal is referred to as the reservoir signal. If all L elements of the bit-stream have been generated, as depicted by the positive branch from decision block 1318, flow continues to block 1320, otherwise flow returns to block 1308 where binary-to-stochastic converters generate the next term in the bit-stream. If all L elements of the bit-stream have been generated, as depicted by the positive branch from decision block 1318, the reservoir signal is input to a delay line, such as a shift register, at block 1320. At block 1322 the contents of the delay line, which represent the state of the reservoir, are combined in an output layer to provide an output signal. The output signal, which is indicative of information extracted from the input signal, is provided at block 1324. The resulting information may be displayed to a local or remote user, supplied to another device, or stored for future use, for example. If all H weights have been applied to the input signal, as depicted by the negative branch from decision block 1326, flow continues to decision block 1328, otherwise flow returns to block 1306 to retrieve the next input weight. If all inputs have been processed, as depicted by the negative branch from decision block 1328, the process terminates at block 1330, otherwise flow returns to block 1304 and the next input value is retrieved.

While this invention is susceptible of being embodied in many different forms, there is shown in the drawings and is herein described in detail specific embodiments, with the understanding that the present disclosure is to be considered as an example of the principles of the invention and not intended to limit the invention to the specific embodiments shown and described. In the description above, like reference numerals may be used to describe the same, similar or corresponding parts in the several views of the drawings.

The term "configured" or the like may relate to the capability of a device whether the device is in an operational or non-operational state. Configured may also refer to specific settings in a device that effect the operational characteristics of the device whether the device is in an operational or non-operational state. In other words, the hardware, software, firmware, registers, memory values, and/or the like may be "configured" within a device, whether the device is in an operational or nonoperational state, to provide the device with specific characteristics. Terms such as "a control message to cause in a device" may mean that a control message has parameters that may be used to configure specific characteristics in the device, whether the device is in an operational or non-operational state.

In addition, it should be understood that any figures that highlight any functionality and/or advantages, are presented for example purposes only. The disclosed architecture is sufficiently flexible and configurable, such that it may be utilized in ways other than that shown. For example, the steps listed in any flowchart may be re-ordered or only optionally used in some embodiments.

While various embodiments have been described above, it should be understood that they have been presented by way of example, and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. Thus, the present embodiments should not be limited by any of the above described exemplary embodiments. In particular, it should be noted that, for example purposes, the above explanation has described examples of a hardware implementation of an artificial neuron and its use in a time delay reservoir (TDR) network. However, one skilled in the art will recognize that embodiments of the invention may employ additional components and devices such as power supplies, clocks, controllers, converters, memory, user and signal interfaces, for example. These have been omitted for the sake of clarity.

The method steps of the implementations described herein are intended to include any suitable method of causing such method steps to be performed, consistent with the patentability of the following claims, unless a different meaning is expressly provided or otherwise clear from the context.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

DRAWING NUMBER KEY

100 Example network
102 Input signal
104 Input layer
106 Reservoir layer
108 Output layer
110, 112, 114 Signals
200 Artificial neural network
202 Mixer
204 Synaptic weight
206 Weighted sum
208 Activation function
210 Neuron output
300 Reservoir
302 Activation function
304 Input signal
306 Mixer
308 Delayed state
310 Bias signal
312 Sum
314 Output signal
316 Delay element
402 XNOR gate
404 Inverter
406 Multiplexer
408 Selection signal
410 Converter
412 Random noise generator
414 q-bit value
416 Seed value
418 Comparator
420 Threshold value
422 Register
424 Output signal
500 Artificial neuron
502 Mixer
504 Input signal
506 Bit-stream
508 Stochastic activation circuit
510,518 Stochastic bit-stream
512 Adder circuit
514 Selection signal
516 Multiplexer
520 Register
522 Converter
524 Delay line
600 TDR circuit
602 Stochastic logic
604 Stochastic input layer
606 Digital signal
608 Converter
610 Input weight
612 Weighted signal
614 Delayed reservoir state
616 Stochastic input bias
618 Mixer
620 Output signal
622 Stochastic activation function
624 Function coefficient
626 Binary signal
628 Converter
630 Register
632 Control block
634 Output layer
636 Output weight
702 Register
704, 802, 810, 900, 1000 Multiplexer
706, 804, 812, 906, 910, 1002, 1004, Selection signal
1006
708 Counter
710 Comparator
712, 814, 1008 Output signal
714 Logic block
716 Converter
718 Weight value
720 XNOR gate
806 Bit-stream
808 Bias bit-stream
902,904 AND gate
908 OR gate
1010 Input signal
1100, 1200 Adder circuit
1102, 1106, 1202 Bit-stream
1104 Delay unit
1108, 1110 AND gate
1112 Counter
1114 Counter output signal 1116 Signal
1200 AND gate
908 OR gate
1010 Input signal
1200 AND gate
1204 1-bit adder
1206 2-bit adder
1208 3-bit adder
1210 4-bit output
1300 Method flow chart
1302 Start block
1304 Input signal
1306 Input weight
1308 Converter
1310 Weighted input bit-stream
1312, 1314 Stochastic bit-stream
1316 Signal update
1318 Decision block
1320 Delay line
1322 Output layer
1324 Output signal
1326, 1328 Decision block
1330 Process terminated

The invention claimed is:

1. An artificial neuron comprising:
a signal mixer configured to mix together two or more input signals and provide a first stochastic bit-stream as output, where the first stochastic bit-stream is representative of a first output value; and
a stochastic activation function circuit configured to receive the first stochastic bit-stream and to generate therefrom a second stochastic bit-stream, the stochastic activation function circuit comprising:
a circuit for generating n independent stochastic bit-streams each representative of the first output value;
an adder circuit configured to sum the n independent stochastic bit-streams and provide a selection signal as output; and
a multiplexer responsive to the selection signal from the adder circuit and configured to select between n+1 coefficient bit-streams dependent upon the selection signal to provide the second stochastic bit-stream,
wherein the stochastic activation function has a characteristic determined by proportion of ones in each of the n+1 coefficient bit-streams.

2. The artificial neuron of claim 1, where the circuit for generating the n independent stochastic bit-streams comprises a shift register having the first stochastic bit-stream as input, where each element of the shift register holds one bit of an independent bit-stream of the n independent stochastic bit-streams.

3. The artificial neuron of claim 1, where the circuit for generating the n independent stochastic bit-streams comprises
a stochastic-to-binary converter configured to convert the first stochastic bit-stream to the first output value; and
a plurality of binary-to-stochastic converters to convert the first output value to a plurality of the n independent stochastic bit-streams.

4. The artificial neuron of claim 1, where the selection signal comprises an N-bit binary selection signal, where $n<2^N$.

5. The artificial neuron of claim 1, where the selection signal comprises a '1-bit hot' selection signal.

6. The artificial neuron of claim 1, where the signal mixer is implemented using stochastic logic.

7. The artificial neuron of claim 1, further comprising:
n+1 registers for storing n+1 binary polynomial coefficient values; and
n+1 binary-to-stochastic converters configured to convert the n+1 binary polynomial coefficient values to the n+1 coefficient bit-streams.

8. An artificial neural network circuit comprising one or more artificial neurons in accordance with claim 1.

9. An artificial neural network circuit responsive to one or more input signals to produce an output signal, the artificial neural network circuit comprising:
an input layer responsive to the one or more input signals to produce a first signal;
a reservoir layer configured to receive the first signal from the input layer and comprising:
a delay line that receives a second signal as input and provides a third signal as output;
a mixer for combining the first signal and the third signal to provide a first stochastic bit-stream as output;
a stochastic logic circuit responsive to the first stochastic bit-stream to produce a second stochastic bit-stream as output, where the stochastic logic circuit implements an activation function; and
a stochastic-to-binary converter that converts the second stochastic bit-stream to the second signal; and
an output layer configured to combine elements of the delay line with one or more output weights to produce the output signal.

10. The artificial neural network circuit of claim 9, where the input layer comprises a stochastic logic circuit.

11. The artificial neural network circuit of claim 10, where the first signal comprises a stochastic bit-stream and where the stochastic logic circuit of the input layer comprises:
a first binary-to-stochastic converter configured to convert a binary input weight value to a weight bit-stream;
a second binary-to-stochastic converter configured to convert an input signal of the one or more input signals to a signal bit-stream; and
a logic gate having the weight bit-stream and the signal bit-stream as inputs and provides the first signal as output,
where the logic gate comprises an XNOR gate when the binary input weight or the input signal is bipolar, and
where the logic gate comprises an AND gate when the binary input weight and the input signal are unipolar.

12. The artificial neural network circuit of claim 9, where the mixer comprises a stochastic logic circuit having one or more multiplexers.

13. The artificial neural network circuit of claim 9, where the mixer combines the first signal, the third signal and a bias signal to provide the first stochastic bit-stream as output.

14. The artificial neural network circuit of claim 9, where the stochastic logic circuit that implements the activation function comprises:
an adder circuit configured to sum n bits of the first stochastic bit-stream and provide an N-bit selection signal as output, where $n<2^N$; and
a multiplexer responsive to the N-bit selection signal from the adder circuit and configured to select between n coefficient bit-streams dependent upon the N-bit selection signal to provide the second stochastic bit-stream,
where the activation function has a characteristic determined by the proportion of ones in each of the n+1 coefficient bit-streams.

15. The artificial neural network circuit of claim 9, where the first stochastic bit stream is representative of a first output value and where the stochastic logic circuit that implements the activation function comprises:

an adder circuit configured to sum n independent bit-streams, each representative of the first output value, to provide an (n+1)-bit selection signal as output; and     a multiplexer responsive to the (n+1)-bit selection signal from the adder circuit and configured to select between n+1 coefficient bit-streams dependent upon the (n+1)-bit selection signal to provide the second stochastic bit-stream,     where the activation function has a characteristic determined by the proportion of ones in each of the n+1 coefficient bit-streams.

16. An integrated circuit comprising the artificial neural network circuit of claim 9.

\* \* \* \* \*